(12) United States Patent
Wang et al.

(10) Patent No.: US 9,337,293 B2
(45) Date of Patent: May 10, 2016

(54) SEMICONDUCTOR DEVICE HAVING ELECTRODE AND MANUFACTURING METHOD THEREOF

(71) Applicant: Taiwan Semiconductor Manufacturing Company, Ltd., Hsin-Chu (TW)

(72) Inventors: Pai-Chieh Wang, Zhubei (TW); Tsung Yao Wen, Hsin-Chu County (TW); Jyh-Huei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/774,470

(22) Filed: Feb. 22, 2013

(65) Prior Publication Data
US 2014/0239417 A1  Aug. 28, 2014

(51) Int. Cl.
| H01L 29/78 | (2006.01) |
| H01L 29/49 | (2006.01) |
| H01L 29/40 | (2006.01) |
| H01L 21/28 | (2006.01) |
| H01L 29/423 | (2006.01) |
| H01L 29/66 | (2006.01) |
| H01L 29/51 | (2006.01) |

(52) U.S. Cl.
CPC .......... *H01L 29/49* (2013.01); *H01L 21/28114* (2013.01); *H01L 29/401* (2013.01); *H01L 29/42376* (2013.01); *H01L 29/517* (2013.01); *H01L 29/66545* (2013.01); *H01L 29/4958* (2013.01); *H01L 29/4966* (2013.01); *H01L 29/513* (2013.01)

(58) Field of Classification Search
CPC ................ H01L 21/283; H01L 21/768; H01L 21/28273; H01L 21/66484; H01L 21/76801; H01L 21/76837; H01L 21/823842; H01L 21/823857; H01L 29/518; H01L 29/4236; H01L 29/7825; H01L 29/66484; H01L 29/66621; H01L 29/66628; H01L 29/66704; H01L 29/66545; H01L 29/823437; H01L 21/28114
USPC .................. 257/407, 412; 438/595, 593, 594
See application file for complete search history.

(56) References Cited

U.S. PATENT DOCUMENTS

| | | | |
|---|---|---|---|
| 6,387,789 B1 * | 5/2002 | Kim ................. | H01L 21/28052 257/E21.199 |
| 6,521,938 B2 * | 2/2003 | Hamamoto ................... | 257/304 |
| 6,949,785 B2 * | 9/2005 | Tu ..................... | H01L 21/31144 257/296 |
| 7,429,767 B2 * | 9/2008 | Bhattacharyya ............. | 257/324 |
| 7,754,559 B2 * | 7/2010 | Aloni ................. | H01L 27/0733 257/E21.204 |
| 7,871,884 B2 * | 1/2011 | Chien .......................... | 438/243 |

(Continued)

FOREIGN PATENT DOCUMENTS

| JP | 2004063901 | 2/2004 |
| JP | 2012004541 A | 1/2012 |

(Continued)

*Primary Examiner* — Jesse Y Miyoshi
*Assistant Examiner* — Stephen C Smith
(74) *Attorney, Agent, or Firm* — Slater & Matsil, L.L.P.

(57) ABSTRACT

The invention relates to integrated circuit fabrication, and more particularly to a semiconductor device with an electrode. An exemplary structure for a semiconductor device comprises a semiconductor substrate; an electrode over the semiconductor substrate, wherein the electrode comprises a trench in an upper portion of the electrode; and a dielectric feature in the trench.

19 Claims, 9 Drawing Sheets

(56) References Cited

U.S. PATENT DOCUMENTS

| | | | | |
|---|---|---|---|---|
| 8,476,701 | B2* | 7/2013 | Ueda | H01L 29/4236 257/330 |
| 8,492,811 | B2* | 7/2013 | Booth, Jr. | H01L 21/84 257/296 |
| 2006/0115950 | A1* | 6/2006 | Kim | H01L 28/91 438/381 |
| 2006/0154436 | A1* | 7/2006 | Kim et al. | 438/396 |
| 2007/0004141 | A1* | 1/2007 | Kim | H01L 21/28114 438/257 |
| 2009/0020827 | A1* | 1/2009 | Mandelman | H01L 29/4958 257/377 |
| 2011/0284951 | A1* | 11/2011 | Ueda | H01L 29/4236 257/330 |
| 2013/0288445 | A1 | 10/2013 | Ueda et al. | |

FOREIGN PATENT DOCUMENTS

| | | |
|---|---|---|
| KR | 10399446 | 9/2003 |
| KR | 100745951 B1 | 8/2007 |

* cited by examiner

FIG. 9C and FIGS. 3A-9C are cross-section views of a semiconductor device comprising an electrode at various stages of fabrication according to various aspects of the present disclosure.

SEMICONDUCTOR DEVICE HAVING ELECTRODE AND MANUFACTURING METHOD THEREOF

TECHNICAL FIELD

The disclosure relates to integrated circuit fabrication, and more particularly to a semiconductor device with an electrode.

BACKGROUND

As the technology nodes shrink, in some integrated circuit (IC) designs, there has been a desire to replace the typical polysilicon gate electrode with a metal gate electrode to improve device performance with decreased feature sizes. One process of forming a metal gate structure is termed a "gate last" process in which the final gate structure is fabricated "last" which allows for a reduced number of subsequent processes, including high temperature processing, that must be performed after formation of the gate.

However, there are challenges to implement such features and processes in complementary metal-oxide-semiconductor (CMOS) fabrication. For example, in a "gate last" fabrication process, dishing in a metal gate electrode is generated after a metal chemical mechanical polishing (CMP) process, thereby increasing the likelihood of device instability and/or device failure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-9C are cross-section views of a semiconductor device comprising an electrode at various stages of fabrication according to various aspects of the present disclosure.

DESCRIPTION

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
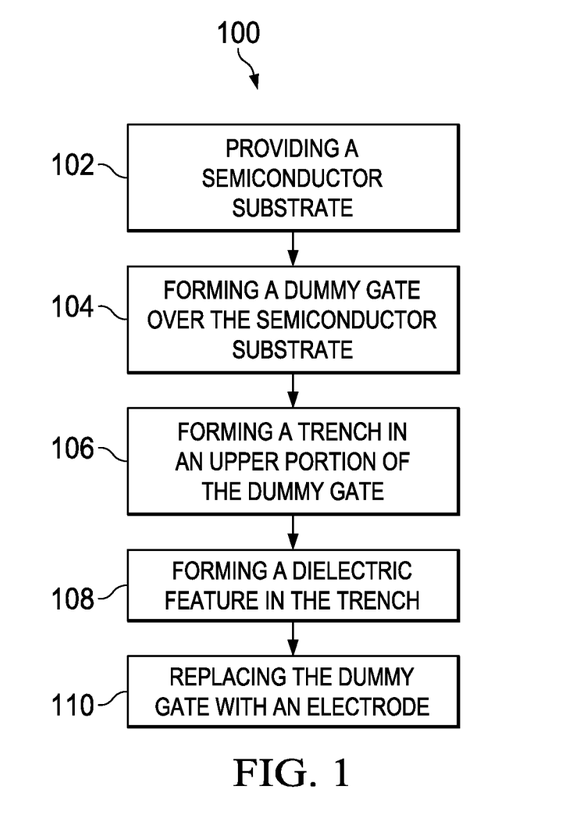
FIG. 1 is a flowchart illustrating a method of fabricating an electrode of a semiconductor device according to various aspects of the present disclosure.

Referring to FIG. 1, illustrated is a flowchart of a method 100 of fabricating an electrode of a semiconductor device according to various aspects of the present disclosure. The method 100 begins with step 102 in which a semiconductor substrate is provided. The method 100 continues with step 104 in which a dummy gate is formed over the semiconductor substrate. The method 100 continues with step 106 in which a trench is formed in an upper portion of the dummy gate. The method 100 continues with step 108 in which a dielectric feature is formed in the trench. The method 100 continues with step 110 in which the dummy gate is replaced with an electrode. The discussion that follows illustrates embodiments of semiconductor devices that can be fabricated according to the method 100 of FIG. 1.

Figure 2:
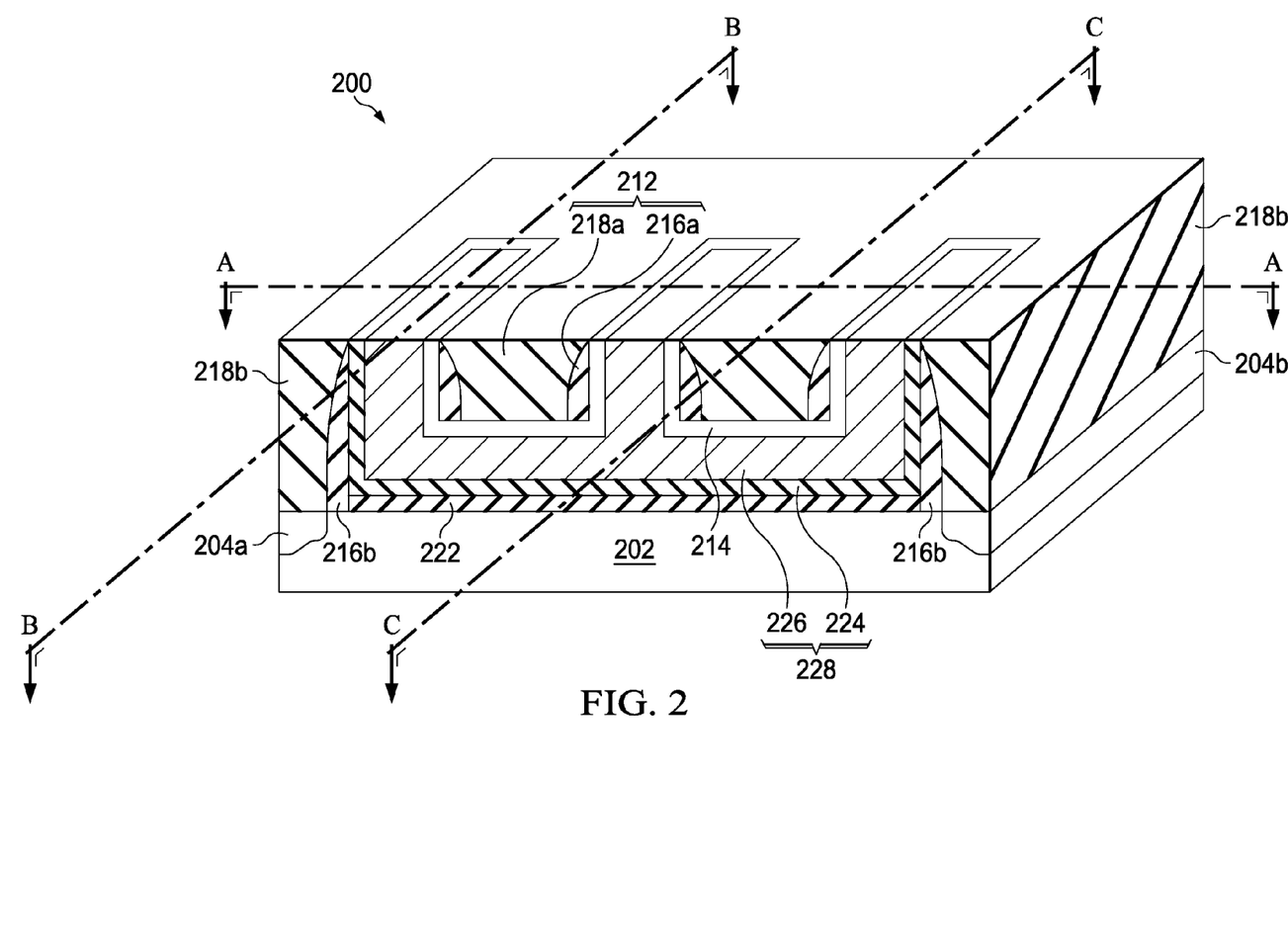
FIG. 2 is a perspective view of a semiconductor device comprising an electrode according to various aspects of the present disclosure.

FIG. 2 is a perspective view of a semiconductor device 200 comprising an electrode 226 according to various aspects of the present disclosure; and FIGS. 3A-9C are cross-section views of the semiconductor device 200 at various stages of fabrication according to various aspects of the present disclosure. Each figure denoted with a letter "A" shows an embodiment taken along line a-a (electrode lengthwise) of FIG. 2; each figure denoted with a letter "B" shows an embodiment taken along line b-b (electrode widthwise without a dielectric feature) of FIG. 2; and each figure denoted with a letter "C" shows an embodiment taken along line c-c (electrode widthwise with a dielectric feature) of FIG. 2.

As employed in the present disclosure, the term semiconductor device 200 refers to a metal-oxide-semiconductor capacitor (MOSCAP). In some embodiments, the term semiconductor device 200 refers to a metal-oxide-semiconductor field effect transistor (MOSFET). In some embodiments, the term semiconductor device 200 refers to a fin field effect transistor (FinFET). The FinFET refers to any fin-based, multi-gate transistor. Other transistor structures and analogous structures are within the contemplated scope of this disclosure. The semiconductor device 200 may be included in a microprocessor, memory cell, and/or other integrated circuit (IC).

It is noted that, in some embodiments, the performance of the operations mentioned in FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and/or after the method 100 of FIG. 1, and that some other processes may only be briefly described herein. Also, FIGS. 2 through 9C are simplified for a better understanding of the concepts of the present disclosure. For example, although the figures illustrate the semiconductor device 200, it is understood the IC may comprise a number of other devices comprising resistors, inductors, and/or fuses, etc.

FIG. 2 illustrates a semiconductor device 200 fabricated by a "gate last" process (the steps in FIG. 1). In the depicted embodiment, the semiconductor device 200 comprises a source region 204a and a drain region 204b in a semiconductor substrate 202; and a gate stack 228 over the semiconductor substrate 202 between the source region 204a and the drain region 204b, wherein the gate stack 228 comprises a gate dielectric 224 and an electrode 226 that is disposed over the gate dielectric 224, wherein the electrode 226 comprises a trench 214 in an upper portion 226a of the electrode 226, wherein a dielectric feature 212 in the trench 214, and wherein the dielectric feature 212 comprises a spacer 216a or an interlayer dielectric (ILD) layer 218a.

Large area semiconductor devices provide chip efficiency depending on design requirements of the IC. For one example, large area MOSCAPs can provide noise isolation for power and signal transmission, or analog, digital signal processor (DSP), and/or radio frequency (RF) designs. For another example, large area MOSFETs can be used as I/O devices. A problem for large area semiconductor devices arises when these semiconductor devices are fabricated in a "gate last" process, where a dummy gate (such as a dummy polysilicon gate) is formed first and then the dummy gate is removed and replaced with a metal gate (the metal electrode of the semiconductor device). For example, since the semiconductor devices consume a large area, dishing in the metal electrode sometimes arises during subsequent processing, such as during various chemical mechanical polishing (CMP) processes. Dishing leads to the semiconductor devices having lower than desirable gate heights (height of the metal electrode). This dishing can also cause shifts in the metal electrode's work function, which can lead to a shift in capacitance-voltage (C-V) characteristics of the semiconductor devices. Depth of focus (DOF) in a metal interconnect structure coupled with various portions of the semiconductor devices can also be degraded, resulting in poor device yield.

Accordingly, the processing discussed below with reference to FIGS. 3A-9C may fabricate a metal electrode comprising a dielectric feature in an upper portion of the electrode. Problems associated with dishing in the metal electrode during CMP processes may be avoided. Thus, Applicant's method may achieve the device performance characteristics, such as threshold voltage.

Figure 3A:
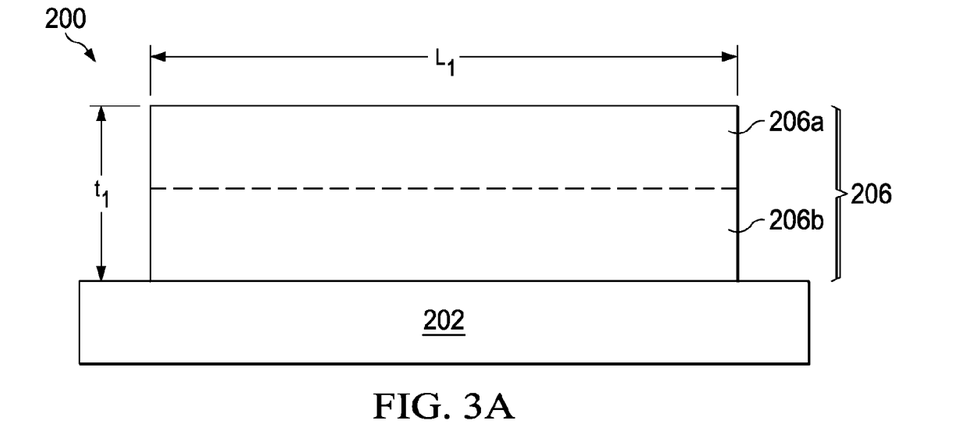
Figure 3B:
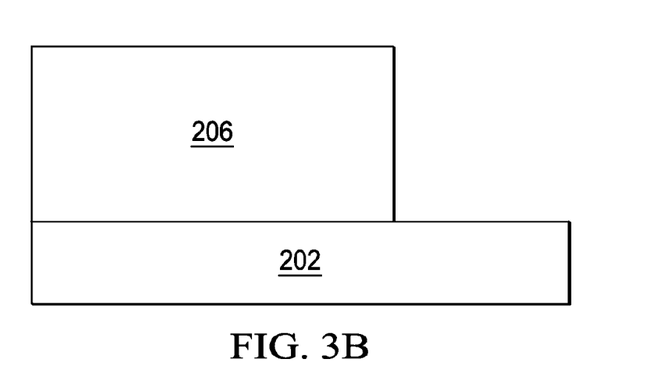
Figure 3C:
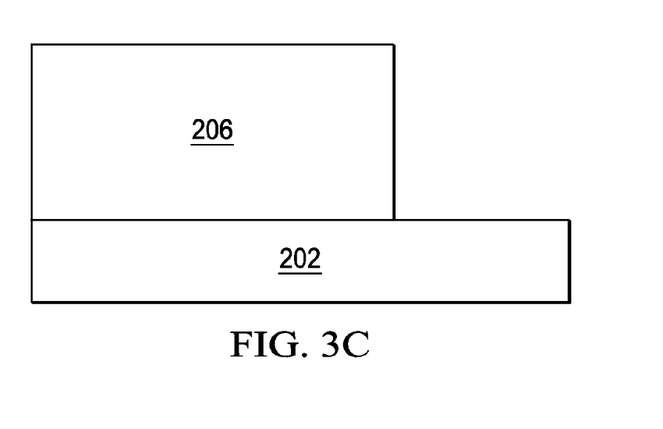

Referring to FIGS. 3A, 3B, and 3C, and step 102 in FIG. 1, a semiconductor substrate 202 is provided. FIG. 3A is a cross-section view of the semiconductor device 200 taken along the line a-a of FIG. 2 having a substrate at one of the various stages of fabrication according to an embodiment, FIG. 3B is a cross-sectional view of semiconductor device 200 taken along the line b-b of FIG. 2, and FIG. 3C is a cross-sectional view of semiconductor device 200 taken along the line c-c of FIG. 2.

The substrate 202 may comprise a silicon substrate. In some embodiments, the substrate 202 may alternatively comprise silicon germanium, gallium arsenic, or other suitable semiconductor materials. The substrate 202 may further comprise other features such as various doped regions, a buried layer, and/or an epitaxy layer. Furthermore, the substrate 202 may be a semiconductor on insulator such as silicon on insulator (SOI). In other embodiments, the semiconductor substrate 202 may comprise a doped epi layer, a gradient semiconductor layer, and/or may further include a semiconductor layer overlying another semiconductor layer of a different type such as a silicon layer on a silicon germanium layer. In other examples, a compound semiconductor substrate may comprise a multilayer silicon structure or a silicon substrate may include a multilayer compound semiconductor structure.

Still referring to FIGS. 3A, 3B, and 3C, the structures in FIGS. 3A, 3B, and 3C are produced by forming a dummy gate 206 over the semiconductor substrate 202 (step 104 in FIG. 1). In the depicted embodiment, a dummy gate electrode layer may be formed over the substrate 202. In some embodiments, the dummy gate electrode layer may comprise a single layer or multilayer structure. In the present embodiment, the dummy gate electrode layer may comprise poly-silicon. Further, the dummy gate electrode layer may be doped poly-silicon with uniform or gradient doping. The dummy gate electrode layer may have a first thickness $t_1$ in the range of about 300 angstroms to about 2000 angstroms. The dummy gate electrode layer may be formed using a low-pressure chemical vapor deposition (LPCVD) process. In one embodiment, the LPCVD process can be carried out in a standard LPCVD furnace at a temperature of about 580° C. to 650° C., and at a pressure of about 200 mTorr to 1 Torr, using silane ($SiH_4$) or dichlorosilane ($SiH_2Cl_2$) as the silicon source gas.

A layer of photoresist (not shown) is formed over the dummy gate electrode layer by a suitable process, such as spin-on coating, and patterned to form a patterned photoresist feature over the dummy gate electrode layer by a lithography patterning method. The patterned photoresist feature can then be transferred using a dry etching process to the dummy gate electrode layer to form the dummy gate 206. The dummy gate 206 comprises an upper portion 206a and a lower portion 206b. In some embodiments, a first length $L_1$ of the dummy gate 206 is in the range of about 100 nm to about 1000 nm. The photoresist layer may be stripped thereafter.

Figure 4A:
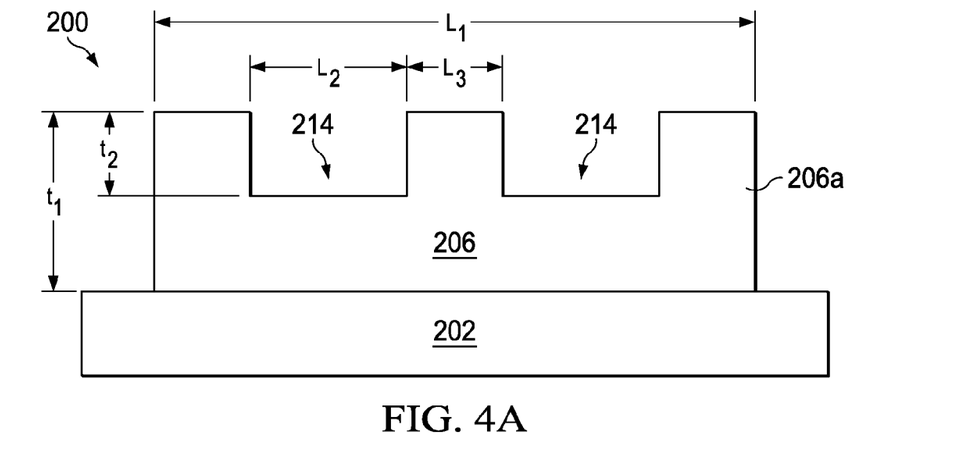
Figure 4B:
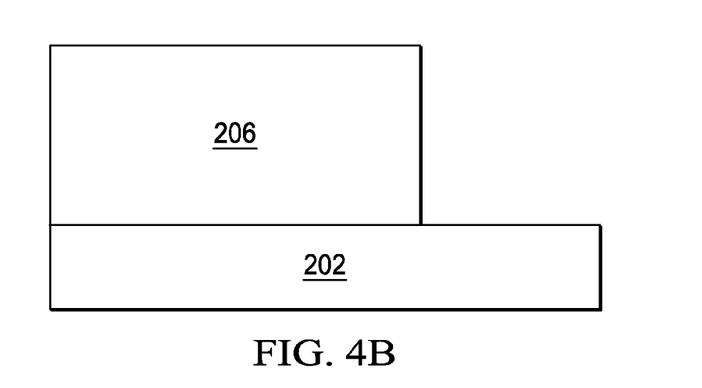
Figure 4C:
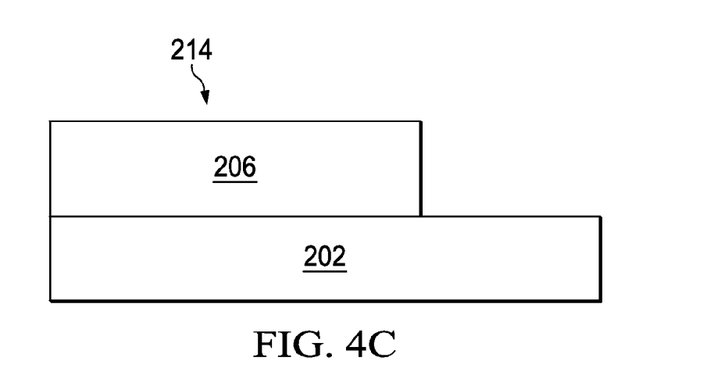

As depicted in FIGS. 4A, 4B, and 4C, and step 106 in FIG. 1, subsequent to formation of the dummy gate 206, the structure in FIGS. 4A, 4B, and 4C is produced by forming a trench 214 in the upper portion 206a of the dummy gate 206. The trench 214 is formed by etching into the dummy gate 206. In the depicted embodiment, two trenches are shown for clarity. In practice, one trench or several trenches may be formed simultaneously. FIG. 4A is a cross-section view of the semiconductor device 200 taken along the line a-a of FIG. 2 having a substrate at one of the various stages of fabrication according to an embodiment, FIG. 4B is a cross-sectional view of semiconductor device 200 taken along the line b-b of FIG. 2, and FIG. 4C is a cross-sectional view of semiconductor device 200 taken along the line c-c of FIG. 2.

In some embodiments, a layer of photoresist (not shown) is formed over the dummy gate 206 and the substrate 202 by a suitable process, such as spin-on coating, and patterned to form a patterned photoresist feature over the dummy gate 206 by a lithography patterning method. The patterned photoresist feature can then be transferred using a dry etching process to the dummy gate 206 to form the trench 214 in the upper portion 206a of the dummy gate 206. In one embodiment, in which the dummy gate 206 is poly-silicon, the step of the dry etch process is performed under a source power of about 650 to 800 W, a bias power of about 100 to 120 W, and a pressure of about 60 to 200 mTorr, using $Cl_2$, HBr and He as etching gases. In some embodiment, the trench 214 may have a second thickness $t_2$ in the range of about 200 angstroms to about 1500 angstroms. In some embodiments, a second length $L_2$ of the trench 214 is in the range of about 5 nm to about 200 nm. In some embodiments, a third length $L_3$ between the trenches 214 is in the range of about 5 nm to about 200 nm. The patterned photoresist feature may be stripped thereafter.

Figure 5A:
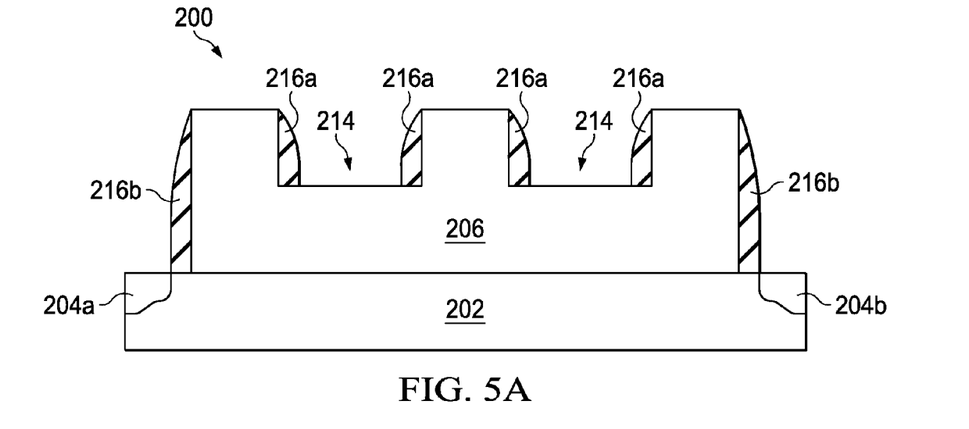
Figure 5B:
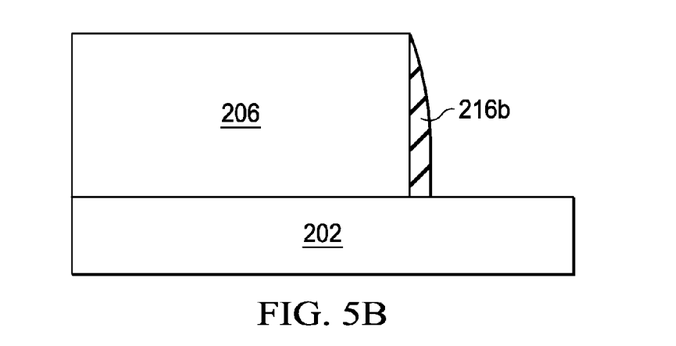
Figure 5C:
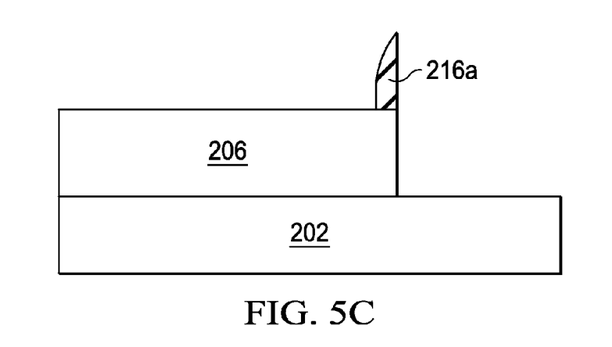

FIG. 5A is a cross-section view of the semiconductor device 200 taken along the line a-a of FIG. 2 having a substrate at one of the various stages of fabrication according to an embodiment, FIG. 5B is a cross-sectional view of semiconductor device 200 taken along the line b-b of FIG. 2, and FIG. 5C is a cross-sectional view of semiconductor device 200 taken along the line c-c of FIG. 2. As shown in FIGS. 5A, 5B, and 5C, after formation of the trench 214 in the upper portion 206a of the dummy gate 206, the optional structures in FIGS. 5A, 5B, and 5C are produced by forming a dielectric layer over the trench 214, the dummy gate 206, and the substrate 202 and covering sidewalls of the trench 214 and sidewalls of the dummy gate 206.

In some embodiments, the dielectric layer may include silicon oxide, silicon nitride, or silicon oxy-nitride. The dielectric layer may comprise a single layer or multilayer structure. The dielectric layer may be formed by CVD, physical vapor deposition (PVD), atomic layer deposition (ALD), or other suitable technique. The dielectric layer comprises a thickness ranging from about 5 nm to about 15 nm. Then, an anisotropic etching is performed on the dielectric layer to form a pair of sidewall spacers 216a on two inner sides of the trench 214 and a pair of sidewall spacers 216b on two outer sides of the dummy gate 206. In the depicted embodiment, the pair of sidewall spacers 216a on the two inner sides of the trench 214 forms a portion of the dielectric feature 212 (also shown in FIG. 2). In some embodiments, an over-etching process may optionally remove the pair of sidewall spacers 216a on the two inner sides of the trench 214.

Still referring to FIGS. 5A, 5B, and 5C, the pair of sidewall spacers 216b on the two outer sides of the dummy gate 206 may be used to offset source/drain (S/D) regions 204. The source/drain (S/D) regions 204 comprise a source region 204a and a drain region 204b. The S/D regions 204 may be formed in the substrate 202 by one or more ion implantation processes. The doping species may depend on the type of device being fabricated, such as an n-type MOSFET or a p-type MOSFET. For example, the S/D regions 204 may be doped with p-type dopants, such as boron or $BF_2$; n-type dopants, such as phosphorus or arsenic; and/or combinations thereof. The S/D regions 204 may comprise various doping profiles, and the S/D regions 204 may be aligned with an outer edge of the pair of sidewall spacers 216b following the ion implantation process. The S/D regions 204 may further include raised S/D regions in some embodiments. Also, one or more contact features (e.g., silicide regions) may be formed on the S/D regions 204 by a self-aligned silicidation process.

Figure 6A:
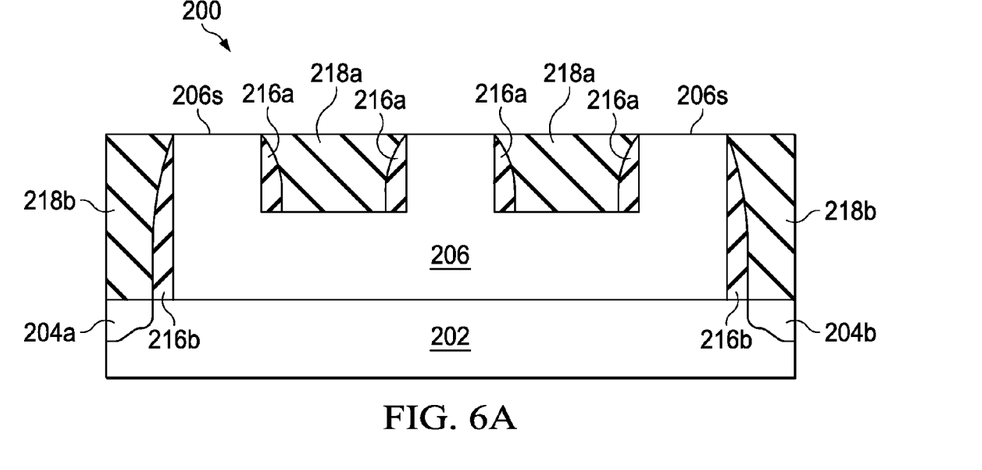
Figure 6B:
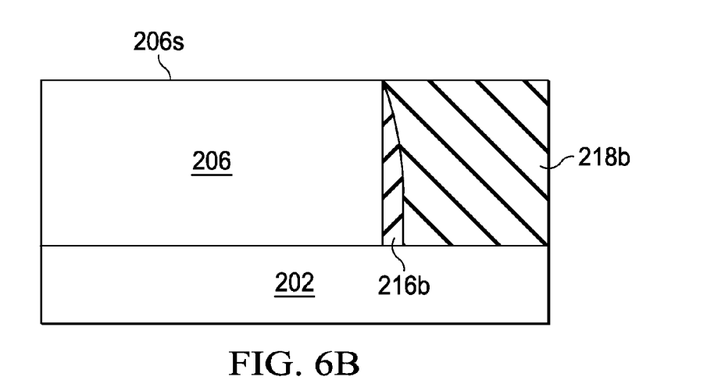
Figure 6C:
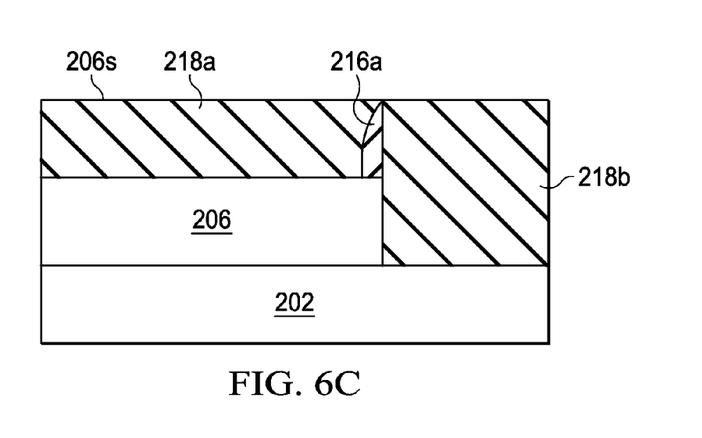

As depicted in FIGS. 6A, 6B, and 6C, and step 108 in FIG. 1, for fabricating an electrode (such as an electrode 226 shown in FIGS. 9A, 9B, and 9C) of the semiconductor device 200, the structures in FIGS. 6A, 6B, and 6C are produced by forming a dielectric feature 218a in the trench 214. FIG. 6A is a cross-section view of the semiconductor device 200 taken along the line a-a of FIG. 2 having a substrate at one of the various stages of fabrication according to an embodiment, FIG. 6B is a cross-sectional view of semiconductor device 200 taken along the line b-b of FIG. 2, and FIG. 6C is a cross-sectional view of semiconductor device 200 taken along the line c-c of FIG. 2.

In some embodiments, an inter-layer dielectric (ILD) layer 218 comprises portions 218a (i.e., the dielectric feature 212) in the trench 214 and portions 218b surrounding the dummy gate 206 (and the pair of sidewall spacers 216b) over the substrate 202. In some embodiments, the dielectric feature 212 in the trench 214 may have the second thickness $t_2$ in the range of about 200 angstroms to about 1500 angstroms. In some embodiments, the second length $L_2$ of the dielectric feature 212 in the trench 214 is in the range of about 5 nm to about 200 nm.

The ILD layer 218 comprises a dielectric material. The dielectric material may comprise silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), and/or combinations thereof. In some embodiments, the ILD layer 218 may be formed by CVD, high density plasma (HDP) CVD, sub-atmospheric CVD (SACVD), spin-on, sputtering, or other suitable methods. In the present embodiment, the ILD layer 218 has a thickness in the range of about 1000 angstroms to about 8000 angstroms. It is understood that the ILD layer 218 may comprise one or more dielectric materials and/or one or more dielectric layers.

Subsequently, the ILD layer 218 is planarized using a chemical mechanical polishing (CMP) process until a top surface 206s of the dummy gate 206 is exposed or reached (shown in FIGS. 6A, 6B, and 6C). The CMP process has a high selectivity to provide a substantially planar surface for the dummy gate 206 and ILD layer 218.

Figure 7A:
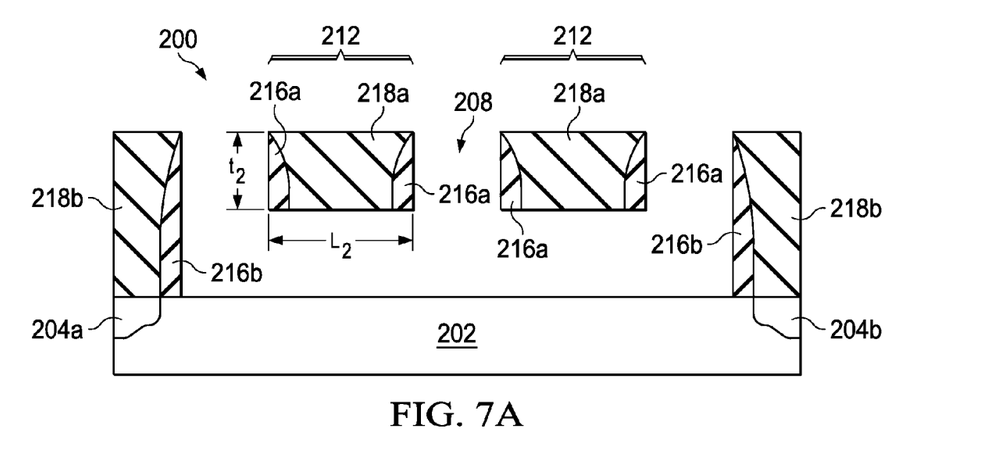
Figure 7B:
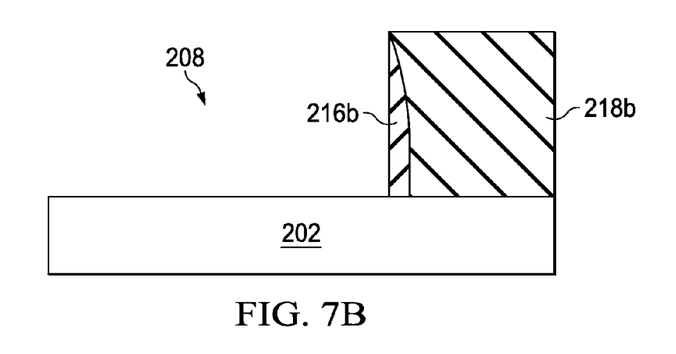
Figure 7C:
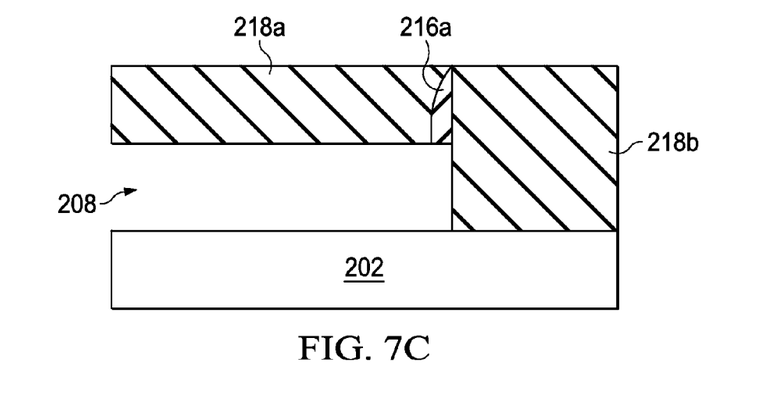

As depicted in FIGS. 7A-9C, and step 110 in FIG. 1, for replacing the dummy gate 206 with the electrode 226, the structure in FIGS. 7A, 7B, and 7C are produced by removing the dummy gate 206 to form an opening 208 in the pair of sidewall spacers 216b by any suitable process. FIG. 7A is a cross-section view of the semiconductor device 200 taken along the line a-a of FIG. 2 having a substrate at one of the various stages of fabrication according to an embodiment, FIG. 7B is a cross-sectional view of semiconductor device 200 taken along the line b-b of FIG. 2, and FIG. 7C is a cross-sectional view of semiconductor device 200 taken along the line c-c of FIG. 2.

The dummy gate 206 may be removed using a wet etch and/or a dry etch process. In at least one embodiment, the wet etch process for dummy poly-silicon gate 206 includes exposure to a hydroxide solution containing ammonium hydroxide, diluted HF, deionized water, and/or other suitable etchant solutions. In other embodiments, the dry etch process for dummy poly-silicon gate 206 may be performed under a source power of about 650 to 800 W, a bias power of about 100 to 120 W, and a pressure of about 60 to 200 mTorr, using $Cl_2$, HBr and He as etching gases.

Figure 8A:
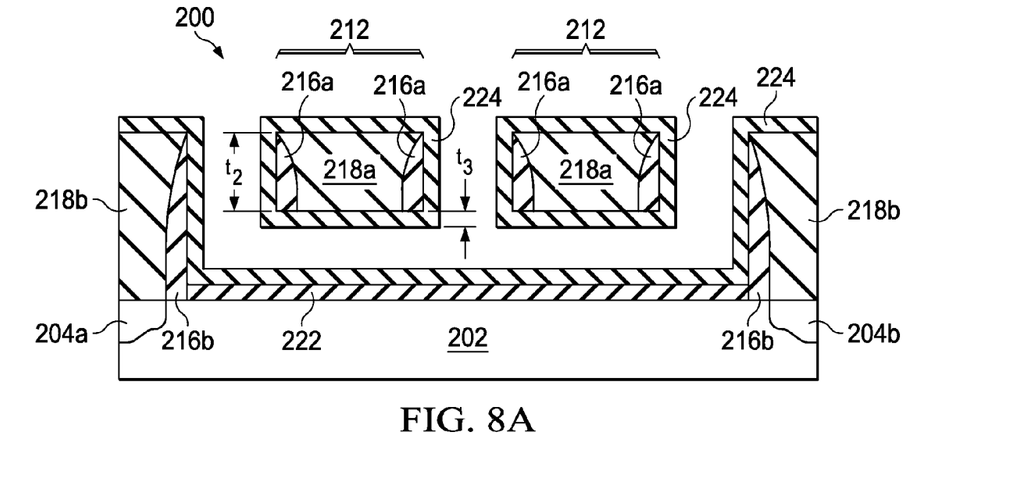
Figure 8B:
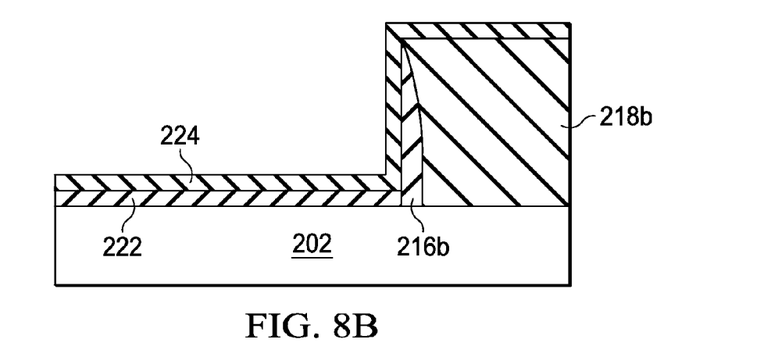
Figure 8C:
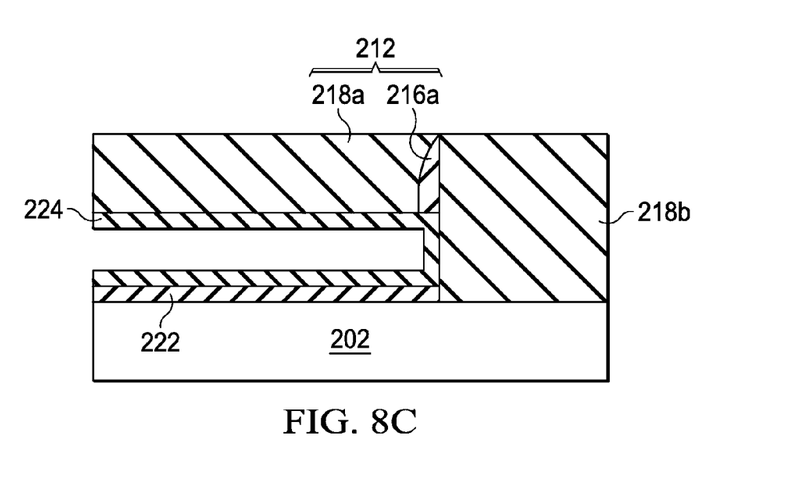

FIG. 8A is a cross-section view of the semiconductor device 200 taken along the line a-a of FIG. 2 having a substrate at one of the various stages of fabrication according to an embodiment, FIG. 8B is a cross-sectional view of semiconductor device 200 taken along the line b-b of FIG. 2, and FIG. 8C is a cross-sectional view of semiconductor device 200 taken along the line c-c of FIG. 2. As shown in FIGS. 8A, 8B, and 8C, after formation of the opening 208 in the pair of sidewall spacers 216b, the structures in FIGS. 8A, 8B, and 8C are produced by forming a gate dielectric layer 224 over the substrate 202.

In some embodiments, the gate dielectric layer 224 may comprise silicon oxide, high-k dielectric material or combination thereof. A high-k dielectric material is defined as a dielectric material with a dielectric constant greater than that of $SiO_2$. The high-k dielectric comprises metal oxide. The metal oxide is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the high-k dielectric 224 comprises $HfO_x$. The gate dielectric layer 224 may be grown by a thermal oxidation process, a chemical vapor deposition (CVD) process, an atomic layer deposition (ALD) process, and may have a third thickness $t_3$ less than 2 nm. In some embodiments, a ratio of the second thickness $t_2$ of the dielectric feature 212 to the third thickness $t_3$ of the high-k dielectric 224 is from about 1 to about 10.

The gate dielectric layer 224 may further comprise an interfacial layer 222 to minimize stress between the gate dielectric layer 224 and the substrate 202. The interfacial layer 222 may be formed of silicon oxide or silicon oxynitride grown by a thermal oxidation process. For example, the interfacial layer 222 can be grown by a rapid thermal oxidation (RTO) process or in a conventional annealing process comprising oxygen.

Figure 9A:
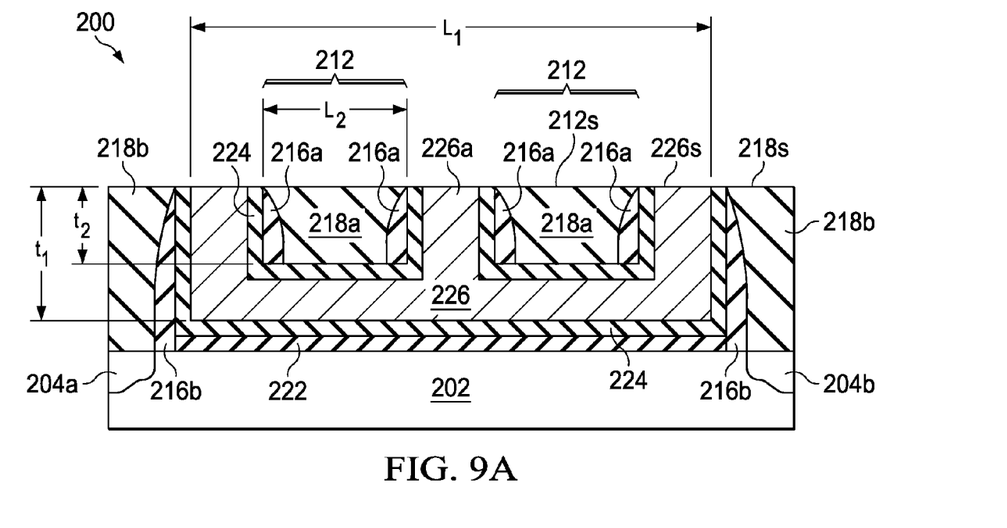
Figure 9B:
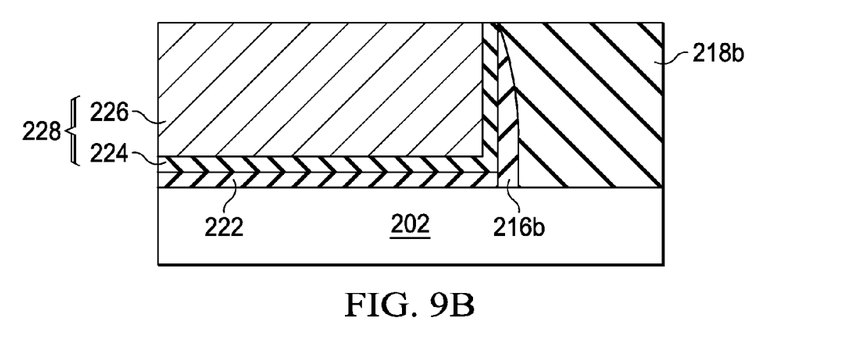
Figure 9C:
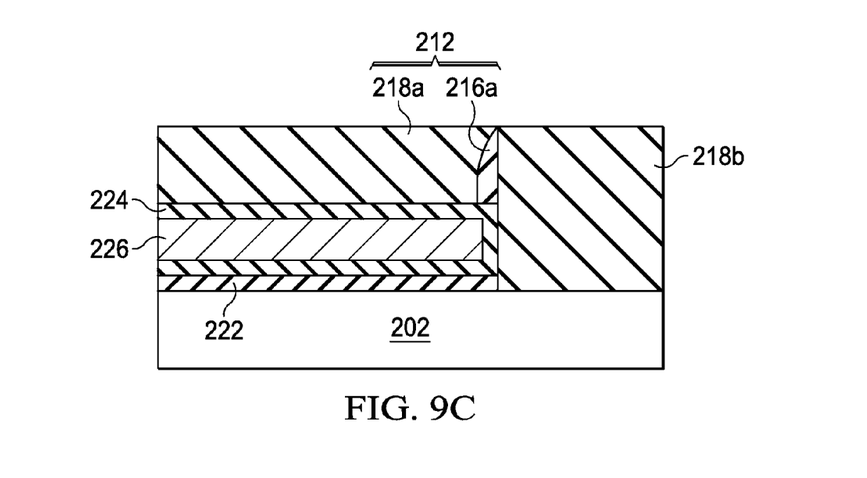

Referring to FIGS. 9A, 9B, and 9C, subsequent to formation of the gate dielectric layer 224, a metal gate electrode layer is formed to completely fill the opening 208. FIG. 9A is a cross-section view of the semiconductor device 200 taken along the line a-a of FIG. 2 having a substrate at one of the various stages of fabrication according to an embodiment, FIG. 9B is a cross-sectional view of semiconductor device 200 taken along the line b-b of FIG. 2, and FIG. 9C is a cross-sectional view of semiconductor device 200 taken along the line c-c of FIG. 2. In some embodiments, the metal gate electrode layer comprises W, Cu, Ti, Ag, Al, TiAl, TiAlN, TaC, TaCN, TaSiN, Mn, Zr, TiN, WN, TaN, or Ru. The metal gate electrode layer may be formed by CVD, plating, ALD, or other suitable technique.

And then, a CMP process may be performed to planarize the metal gate electrode layer to form the electrode 226. The CMP process may remove a portion of the metal gate electrode layer until a top surface 218s of the ILD layer 218 is reached. In other words, a top surface 212s of the dielectric feature 212 is substantially coplanar with a top surface 226s of the electrode 226. In some embodiments, the electrode 226 (equal to the dummy gate 206) may have the first thickness $t_1$ in the range of about 300 angstroms to about 2000 angstroms. In some embodiments, a ratio of the second thickness $t_2$ of the dielectric feature 212 to the first thickness $t_1$ of the electrode 226 is from about 0.5 to about 0.75. In some embodiments, the first length $L_1$ of the electrode 226 (equal to the dummy gate 206) is in the range of about 100 nm to about 1000 nm. In some embodiments, a ratio of the second length $L_2$ of the dielectric feature 212 to the first length $L_1$ of the electrode 226 is from about 0.1 to about 0.9.

In some embodiments, the gate dielectric layer 224 and the electrode 226 are combined and referred as a gate stack 228 of the semiconductor device 220. In some embodiments, a channel is defined below the gate stack 228 in the substrate 202 between the source region 204a and the drain region 204b. In the present embodiment, the electrode 220 comprises the trench 214 in the upper portion 226a of the electrode 226 and a dielectric feature 212 in the trench 214. Problems associated with dishing in the metal electrode during CMP processes may be avoided. Thus, Applicant's method may achieve the device performance characteristics, such as threshold voltage.

Then, subsequent processes, including interconnect processing, must be performed after forming the electrode 226 to complete the semiconductor device 200 fabrication.

In accordance with embodiments, a semiconductor device comprises a semiconductor substrate; an electrode over the semiconductor substrate, wherein the electrode comprises a trench in an upper portion of the electrode; and a dielectric feature in the trench.

In accordance with another embodiment, a semiconductor device comprises a source region and a drain region in a semiconductor substrate; and a gate stack over the semiconductor substrate between the source region and the drain region, wherein the gate stack comprises a gate dielectric and an electrode that is disposed over the gate dielectric, wherein the electrode comprises a trench in an upper portion of the electrode, and wherein a dielectric feature in the trench.

In accordance with another embodiment, a method of fabricating a semiconductor device comprises providing a semiconductor substrate; forming a dummy gate over the semiconductor substrate; forming a trench in an upper portion of the dummy gate; forming a dielectric feature in the trench; and replacing the dummy gate with an electrode.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device comprising:
    a semiconductor substrate having a source and a drain of a transistor disposed therein;
    an electrode over the semiconductor substrate and disposed between the source and the drain, wherein the electrode has a trench in an upper portion of the electrode, wherein the trench extends below a topmost surface of the electrode, wherein the electrode extends along a bottom surface of the trench, wherein a lower surface of the electrode does not extend below an upper surface of the semiconductor substrate; and
    a dielectric feature in the trench, wherein the dielectric feature includes spacers along sidewalls of the trench and a dielectric filler interposed between the spacers, wherein a top surface of the dielectric feature is substantially coplanar with a top surface of the electrode.

2. The semiconductor device of claim 1, wherein a ratio of a thickness of the dielectric feature to a thickness of the electrode is from about 0.5 to about 0.75.

3. The semiconductor device of claim 1, wherein a ratio of a length of the dielectric feature to a length of the electrode is from about 0.1 to about 0.9.

4. The semiconductor device of claim 1 further comprising a high-k dielectric between the electrode and the dielectric feature.

5. The semiconductor device of claim 4, wherein a ratio of a thickness of the dielectric feature to a thickness of the high-k dielectric is from about 1 to about 10.

6. A semiconductor device comprising:
    a source region and a drain region in a semiconductor substrate; and
    a gate stack over the semiconductor substrate between the source region and the drain region, the gate stack comprising a gate dielectric and a gate electrode that is disposed over the gate dielectric, the gate electrode comprising a trench in an upper portion of the electrode, and a dielectric feature in the trench, a depth of the trench being less than a thickness of the gate electrode;
    wherein the gate electrode is a conductive material;
    wherein a bottom surface of the trench is disposed below a topmost surface of the gate electrode; and
    wherein a topmost surface of the dielectric feature is substantially coplanar with a topmost surface of the gate electrode, the topmost surface of the dielectric feature being substantially planar.

7. The semiconductor device of claim 6, wherein a ratio of a thickness of the dielectric feature to a thickness of the gate electrode is from about 0.5 to about 0.75.

8. The semiconductor device of claim 6, wherein a ratio of a length of the dielectric feature to a length of the gate electrode is from about 0.1 to about 0.9.

9. The semiconductor device of claim 6, wherein the dielectric feature comprises a spacer or an interlayer dielectric layer disposed on a sidewall of the trench.

10. The semiconductor device of claim 6 further comprising a high-k dielectric between the gate electrode and the dielectric feature.

11. The semiconductor device of claim 10, wherein a ratio of a thickness of the dielectric feature to a thickness of the high-k dielectric is from about 1 to about 10.

12. The semiconductor device of claim 10, wherein the high-k dielectric comprises $HfO_x$.

13. The semiconductor device of claim 10, wherein the high-k dielectric is selected from the group consisting essentially of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof.

14. The semiconductor device of claim 6, wherein the gate electrode comprises W, Cu, Ti, Ag, Al, TiAl, TiAlN, TaC, TaCN, TaSiN, Mn, Zr, TiN, WN, TaN, or Ru.

15. The semiconductor device of claim 6, wherein a channel is defined below the gate stack in the substrate between the source region and the drain region.

16. A device comprising:
- a source region and a drain region in a semiconductor substrate; and
- a gate dielectric layer disposed over the semiconductor substrate;
- a gate electrode disclosed over the gate dielectric layer, the gate electrode having a first trench extending from a topmost surface of the gate electrode into the gate electrode, the gate electrode extending completely below the first trench from a first sidewall of the first trench to a second sidewall of the first trench; and
- a first dielectric feature in the first trench, the first dielectric feature having a topmost "surface that is coplanar with the topmost surface of the gate electrode and coplanar with" the topmost surface of the gate dielectric layer, wherein the gate electrode comprises a second trench adjacent to the first trench, a first portion of the gate electrode separating the first trench from the second trench, and wherein a second dielectric feature is disposed in the second trench.

17. The device of claim 16, wherein each of the first dielectric feature and the second dielectric feature comprises a plurality of dielectric features.

18. The device of claim 1, wherein the electrode comprises a plurality of trenches.

19. The device of claim 6, wherein the gate electrode comprises a plurality of trenches.

* * * * *